United States Patent [19]

Arakawa

[11] Patent Number: 4,703,196
[45] Date of Patent: Oct. 27, 1987

[54] HIGH VOLTAGE PRECHARGING CIRCUIT
[75] Inventor: Hideki Arakawa, Yokohama, Japan
[73] Assignee: Fujitsu Limited, Kawasaki, Japan
[21] Appl. No.: 763,628
[22] Filed: Aug. 8, 1985
[30] Foreign Application Priority Data Aug. 13, 1984 [JP] Japan .............................. 59-169060

[51] Int. Cl.$^4$ ........................ H03K 17/56; H03K 3/01
[52] U.S. Cl. ................................ 307/246; 307/296 R; 307/304
[58] Field of Search ............... 307/246, 444, 607, 582, 307/297, 296 A, 296 R, 304

[56] References Cited

U.S. PATENT DOCUMENTS

| | | | |
|---|---|---|---|
| 4,390,798 | 6/1983 | Kurafuji | 307/297 |
| 4,439,692 | 3/1984 | Beekmans et al. | 307/297 |
| 4,463,273 | 7/1984 | Dingwall | 307/443 |
| 4,503,345 | 3/1985 | Yamamura | 307/605 |

Primary Examiner—Stanley D. Miller
Assistant Examiner—B. P. Davis
Attorney, Agent, or Firm—Staas & Halsey

[57] ABSTRACT

A precharging circuit employing ordinary enhancement (E) types MIST'S produces erasing and writing (E-W) voltages to change the data stored in an EE-PROM fabricated in a common memory chip with the circuit. The E-W voltage increases gradually from a low level to a high level over a long time interval determined substantially by a long time constant RC circuit, the voltage charge developed on the capacitor C comprising the E-W voltage. The resistor R is implemented by a first MIST connected between a high voltage source and the capacitor C, the gate thereof being controlled by a charge-pump (CP) circuit and a second MIST. The CP circuit is connected between the capacitor C and the gate of the first MIST and is rendered operative during successive clock pulses of a series of clock pulses applied thereto. The CP circuit, during each clock interval, produces a voltage output applied to the first MIST which exceeds the threshold voltage $V_{th}$ thereof, whereby the first MIST periodically is turned ON for conducting a charging current which flows into the capacitor C. The second MIST is connected between the gate of the first MIST and the capacitor C for suppressing the gate voltage of the first MIST thereby limiting the interval during which the charging current flows therethrough, to a limited portion of each clock pulse interval. The intermittent charging current establishes a long time interval for charging the capacitor C to a value substantially equal to the high voltage source.

12 Claims, 7 Drawing Figures

HIGH VOLTAGE PRECHARGING CIRCUIT

BACKGROUND OF THE INVENTION

1. Field of the Invention

The present invention relates to a precharging circuit fabricated in an IC (integrated circuit) chip or die, and, more particularly, to such a precharging circuit which may be fabricated using conventional MIST devices and which is small in size, yet affords a long charging time interval.

2. State of the Prior Art

A precharging circuit having an extremely large time constant charging characteristic often is required in IC devices. A typical example of the use of such a circuit is for generating an E-W (erasing and writing) voltage, which has a characteristic that it gradually rises in voltage over a long time interval from a low level to a high level, for example, 20–30 volts, in contrast to the ordinary power supply voltage of 5 volts for IC devices. The E-W voltage is used for changing the data stored in an EEPROM (electrically erasable programmable read only memory) or a NOVRAM (nonvolatile random access memory), such as may be fabricated in a common memory chip with the precharging circuit. Typically, the E-W voltage is generated in response to a change command applied to the memory chip from a computer system in which the memory chip is incorporated.

The NOVRAM combines the functions of a static RAM (SRAM) and an EEPROM, so that it operates as a SRAM when the computer system is operating; however, the data in the SRAM is transferred to the EEPROM and stored therein when the power supply for the computer system is turned off. Since the NOVRAM is a special type of EEPROM and since the precharging circuit of the present invention is equally applicable thereto, for convenience, further reference herein shall be limited solely to EEPROM devices, it being understood that such reference encompasses NOVRAM and other similar such devices.

EEPROM devices are used extensively in computer systems, because the data stored therein can easily be changed, particularly by comparison with other EPROM (erasable programmable read only memory) devices. For example, whereas UV-EPROM (ultraviolet rays-controlled EPROM) devices as well have been employed extensively in computer systems, they present certain inconveniences. Particularly, a UV-EPROM memory chip, or a board on which such a memory chip is mounted, must be removed from the computer system to permit irradiating same with ultraviolet rays for erasing the data stored therein when the data must be changed. By contrast, in an EEPROM device, the data can easily be changed electrically, by a program previously provided for that purpose, thus eliminating any need to remove the associated memory chip, or a board on which the chip is mounted, from the computer system.

EEPROM devices, however, present a different problem, namely that the E-W voltage must be applied to the EEPROM for a lengthy time interval, in the range of from 100 micro-sec ($\mu S$) to 10 mill-sec (mS), for changing the data therein. Such a time interval is extraordinarily great, particularly in the context of the nanosecond speeds of operation common in the computer field today. Thus, it is difficult to provide such a long time interval, in a computer system. Moreover, the means for establishing the requisite time interval of the E-W voltage usually are provided in a memory chip; absent that provision, for example, if means external to the chip are employed, the processing speed of the computer system almost invariably will be reduced. As a specific example, if the CPU (central processing unit) of the computer system is employed for this purpose, it would be occupied for an extensive period in generating the lengthy time interval of the E-W voltage for changing the data in the EEPROM, with the result that the overall processing speed of the computer system necessarily would be significantly decreased. Conversely, if the time interval determining means is provided directly on the memory chip, the problem is pressented that a significant amount of space on the chip is required therefor, contributing to increased fabricating costs for the chip.

When an E-W voltage having the described, requisite waveform is applied to the EEPROM, electrons or holes are injected into the EEPROM, functioning in accordance with the well known tunneling phenomenon, for erasing or writing data therein; however, if the E-W voltage were to increase rapidly to the high level, the tunnel effect layer fabricated within the EEPROM would break down. Thus, it is critical that the E-W voltage waveform have a gradually rising leading edge, to achieve accurate operations. Consistent therewith, the E-W voltage for an EEPROM typically must have a waveform which rises gradually from a low to a high level over a lengthy time interval, such as from 100 $\mu S$ to 500 $\mu S$, and then remains at the high level for an extremely long time interval, such as from 5 mS to 10 mS, both for erasing the stored data and for writing new data into the EEPROM.

Typically, a high voltage waveform generator is employed to generate the E-W voltage of the requisite waveform including the gradual leading or rising edge, and a timer circuit controls the long time interval, as is required for erasing and writing operations. Both the waveform generator and the timer circuit are fabricated in the IC chip and have respectively associated therewith a precharging circuit. The typical precharging circuit comprises, essentially, an RC (resistor and capacitor) circuit having a long time constant; moreover, in the timer circuit, the long time interval is determined by the time period from the initiation of the precharging operation to the completion thereof, at which the voltage level of the precharging node (i.e., a circuit node at which the requisite precharging voltage is developed) reaches a predetermined value. A high voltage source establishes the predetermined value for the precharging operation, in order to prolong the time interval.

FIG. 1(a) is a circuit schematic of a prior art precharging circuit. A depletion (D)-type MIST (metal insulator semiconductor transistor) $T_R$ functions as the resistor (R) of the RC time constant charging circuit, and is connected between a high voltage source $V_{pp}$ and a capacitor C. A charging current flows from the high voltage source $V_{pp}$ through transistor $T_R$ to the capacitor C, producing a precharging voltage $V_n$ at the circuit node, or connection, between transistor $T_R$ and capacitor C, which voltage $V_n$ increases with time, as shown in FIG. 1(b). In particular, the precharging voltage $V_n$ increases from essentially zero volts (0 V) to a value slightly less than that of the high voltage source $V_{pp}$ over the time interval $t=0$ to $t=t_4$. The voltage $V_n$ thereafter asymptotically approaches that of the high voltage source $V_{pp}$, over the time interval $t=t_4$ to $t=t_5$.

For purposes of erasing data stored in an EEPROM, the time interval t=0 to t=t₄ is approximately from 100 μS to 500 μS; for the case of writing new data into an EEPROM, the time interval t=0 to t=t₅ is 5 mS to 10 mS. The specific time intervals employed for the respective erasing and writing operations, within the indicated ranges, are dependent upon the characteristics of the particular EEPROM.

As before noted, a precharging circuit as shown in FIG. 1(a) may be associated with each of a high voltage waveform generator and a timer circuit, which respectively function as hereinbefore set forth. Each of the high voltage waveform generator and the timer circuit are triggered by the E-W control signals applied externally to the EEPROM chip by the computer system. Typically, a high voltage in the range of 25 V (volts) is required for generating the long time interval in the RC circuit, and typically is supplied from a high voltage source fabricated in the IC chip. Particularly, the high voltage source comprises a clock oscillator and a charge-pumping circuit, the clock oscillator generating a clocking signal, or train, comprising series of clock pulses, the charge-pumping circuit functioning under the control of the clock pulses to produce the requisite high voltage.

Prior art precharging circuits of the type shown in FIG. 1(a) however, present problems as to the fabrication of the capacitor C and the transistor $T_R$, with associated operational problems. Particularly, capacitor C must have a quite large value of capacitance, such as greater than 10 picofarad (pF) for obtaining a sufficiently long time constant, such as in the range of from 10 μS to 10 mS; further, since the dielectric material of the capacitor C is afforded by an insulating layer (typically silicon dioxide), the layer must be of substantial thickness so as to withstand the high voltage to be developed. As a result, the capacitor must be of substantial size, for example, from a minimum of 100×100 μm² to 400×400 μm² (μm=micro meter).

The transistor $T_R$ as well presents problems in its fabrication, in view of its operating characteristics in relation to the conditions imposed by the RC precharging circuit, as illustrated in FIG. 1(a). Particularly, as the precharge voltage $V_n$ increase in amplitude, it imposes an increasing level of back bias voltage on transistor $T_R$ which functions to turn transistor $T_R$ OFF (i.e., render it nonconducting), prior to the precharging voltage $V_n$ increasing to the level of the high voltage source $V_{pp}$, if transistor $T_R$ is an ordinary depletion (D) type transistor having an ordinary threshold voltage $V_{th}$. Accordingly, conventional D type MIST devices cannot be used in a precharging circuit as shown in FIG. 1(a), since the precharging voltage $V_n$ cannot increase to the requisite level approaching $V_{pp}$; thus, the required long time interval as well cannot be achieved.

Accordingly, a modified transistor $T_R$ must be employed, known as a special D type MIST (or, also, as a modified MIST), which has a very low threshold voltage $V_{th}$—meaning a threshold $V_{th}$ of a large absolute, but negative polarity, value. Such a modified MIST is very expensive, because its fabrication requires use of a special mask and ion implantation processes, for isolating it from other, conventional MIST's which may be adjacent to it in a memory chip. Particularly, the ion implantation is required for lowering the threshold voltage $V_{th}$.

The use of a modified MIST, moreover, presents additional problems in view of the necessary relationship between channel width (W) and channel length (L). Particularly, as is well known, the current-voltage characteristic of a MIST (i.e., the characteristic relationship between the source-drain current and the gate-source voltage of the MIST) is such that the ratio of the source-drain current to the gate-source voltage is in proportion to the ratio W/L. Since the size (i.e., area on the chip) of a MIST depends mostly on the required channel length (L), to maintain a given current-voltage characteristic, factors affecting the channel width (W) correspondingly will affect the channel length (L) so as to maintain the required W/L ratio, and accordingly affect the required size of a MIST.

Thus, to minimize the size of the MIST, it is desirable to minimize the channel width (W)—i.e., to employ a narrow channel width (W). However, it is difficult to reduce the channel width (W) of a modified MIST to a value less than, or more narrow than, approximately 4 μm. In general, this difficulty is presented in view of the necessary process steps performed in fabricating a MIST. Particularly, a channel cut is formed around the MIST by implanting boron ions (B+) around the field oxide layer (FOX) used as the source and the drain of the MIST, to avoid producing parasitic transistors in the chip. The boron ions thus implanted, however, tend to diffuse out beyond the channel cut and into surrounding portions of the chip, during thermal diffusion process steps.

The problems attendant fabrication of a modified MIST are more fully understood with reference to FIGS. 2(a) and 2(b), FIG. 2(a) comprising a cross-sectional view, in somewhat simplified schematic form, of such a modified MIST and FIG. 2(b) illustrating the corresponding threshold voltage $V_{th}$ characteristic, in relation to the configuration of the MIST and its channel width (W) as shown in FIG. 2(a). Particularly, the modified MIST 10 of FIG. 2(a) comprises a gate electrode 11, FOX layer 12, and boron doped regions 13 associated with the FOX layer 12. The channel width (W) of the MIST 10 schematically is illustrated to extend between the boundaries between the portions of the FOX 12 and the substrate underlying the gate electrode 11. The boron doped regions 13, however, overlap the peripheral portions of the channel width (W), which overlapped portions are designated ΔW. The threshold voltage $V_{th}$ of modified MIST 10 is higher in the overlapped portions ΔW of the channel width (W), than in the central or nonoverlapped portions (W−2 ΔW). Stated alternatively, and with reference to the designations in FIG. 2(a), the combined overlapped portions (2 ΔW) presents a high threshold voltage $V_{th}$ relative to the nonoverlapped portion (W−2ΔW) having the desired, low threshold voltage $V_{th}$. FIG. 2(b) illustrates the voltage threshold characteristic $V_{th}$ in relation to the channel width (W); as is readily seen therein, the threshold $V_{th}$ increases in the regions corresponding to the overlapped portions ΔW.

Thus, since the size of the overlapped portions, 2 ΔW, is a function of the required level of ion implantation represented by the boron doped regions 13, if the total width W is too narrow, the resulting threshold voltage $V_{th}$ is too high. Particularly, the portion 2 ΔW having the high threshold voltage $V_{th}$ becomes superior to, or predominates, the central, nonoverlapped portion (W−2 ΔW) having the low threshold voltage $V_{th}$, out of the total channel width (W). Thus, it is difficult to fabricate a modified MIST which has a low threshold voltage $V_{th}$, unless the channel width (W) is of substantial width.

For the reasons above explained, therefore, the channel width (W) of a modified MIST cannot be made narrow and as a result, to maintain a required ratio W/L to provide the requisite current-voltage characteristic, the channel length (L) as well must be large. Typically, the channel length (L) of a modified MIST must be in the range of from 100 μm to 1,000 μm, to achieve a time constant greater than 100 μS for the RC precharging circuit. Thus, it has been impossible in the prior art to fabricate a capacitor C and a transistor $T_R$ which are small in size and yet satisfy the requirements of a precharging circuit as in FIG. 1(a) above discussed; in fact, it has been difficult to achieve a long time interval, such as 10 mS, even where a transistor $T_R$ has a channel length as great as 100 μm and the capacitor C is of a size, or area, as great as 400×400 μm².

The channel length (L), moreover, presents yet another problem imposing practical limitations on successful implementation of the prior art circuits. Particularly, when the temperature of a memory chip increases, as is typical in normal operation, a leakage current which flows in a junction of the MIST correspondingly tends to increase. The leakage current must be compensated by causing a compensating current flow through the channel of the MIST. However, an adequate compensating current cannot be made to flow when the channel length (L) is as great as 1,000 μm. As a result, to obtain the requisite long time interval, the only possibility is to increase the capacitance of capacitor C. However, increasing the capacitance imposes the necessary requirement of increasing the size of the capacitor C, and therefore the size of the memory chip.

Thus, precharging circuits of the prior art present serious problems in implementation, both as to cost and as to size; moreover, such prior art precharging circuits do not afford the high degree of reliability in operation which is desired.

SUMMARY OF THE INVENTION

An object of the present invention, therefore, is to provide a precharging circuit having a relatively slow charging rate characteristic with respect to its size.

A further object of the invention is to provide an improved precharging circuit having a long charging time interval, for use in an erase-write voltage generator or a timing circuit, such as are employed to change the data of an EEPROM or an NOVRAM and which are fabricated in a common memory chip therewith.

A further object of the present invention is to provide a precharging circuit for charging a capacitor to a relatively high voltage, without employing a special depletion type MIST.

Yet another object of the present invention is to provide an improved precharging circuit which enables use of a charging capacitor of conventional capacitance value, but which affords a relatively slow charging rate characteristic.

Still another object of the present invention is to provide a precharging circuit of decreased size, yet which provides a relatively slow charging rate characteristic.

Still a further object of the present invention is to provide an improved precharging circuit of decreased fabrication cost.

Still a further object of the present invention is to provide a precharging circuit affording improved accuracy in the control of a long time interval produced thereby.

Still another object of the present invention is to provide a precharging circuit having a circuit configuration and related physical implementation which afford improved reliability in operation.

The precharging circuit of the present invention comprises, as basic components, a charge-storing capacitor, a first MIS transistor (MIST 1) for precharging the capacitor, a charge-pump circuit, and a voltage suppressing means which, in cooperation with the charge-pump circuit, controls the gate voltage of the MIST 1. The charge-pump circuit is driven by a series of clock pulses and generates a succession of incrementally higher voltage levels with reference to the voltage level developed at a precharging node to which the capacitor is connected. Each such incrementally higher voltage level thus obtained is applied to the gate of the MIST 1 to turn it on and thereby causes a small precharging current to flow through the MIST 1 to the precharging capacitor. During the precharging operation, the voltage at the gate of the MIST 1 is increased along with the increase of the precharging voltage as produced by the charge-pump circuit under control of the series of clock pulses which is applied thereto.

The voltage suppressing means preferably comprises a second MIS transistor (MIST 2) having both its gate and source connected to the gate of the MIST 1, and a drain connected to the precharging node. Advantageously, both MIST 1 and MIST 2 are produced in a common IC chip and thus have substantially the same threshold voltage characteristic. In this configuration, MIST 2 suppresses the voltage applied to the gate of MIST 1 from the charge-pump circuit, so that the charging current flows only during short time intervals corresponding to the timing of the clock pulses.

Since the charge-pump circuit uses the precharging voltage developed on the precharging capacitor as a source voltage, as each clock pulse is applied, the output voltage applied to the gate of MIST 1 always exceeds the threshold voltage of MIST 1. Thus, MIST 1 may comprise an ordinary or conventional enhancement type MIST, even as the level of the precharging voltage undergoes a substantial increase, from a low level to a high level, over a long time interval. Since the charging current which flows intermittently through MIST 1 is limited to a small value, the precharging circuit can generate an erase-write voltage having a long time interval, even though employing a precharge capacitor having a small capacitance value.

Thus, in accordance with the present invention, the precharging circuit may afford a very long time interval while using only a capacitor of small capacitance value and ordinary enhancement MIS transistors (i.e., MIST 1 and MIST 2). Further, through association of the charge-pump circuit with the precharging circuit, MIST 1 is effective for controlling the charging current, even though the MIST 1 is subjected to a substantial reverse bias voltage.

These and other objects and advantages of the present precharging circuit of the present invention will become more apparent from the following detailed description, taken in conjunction with the accompanying drawings, to which reference is now made.

DETAILED DESCRIPTION OF THE PREFERRED EMBODIMENT

Figure 1A:
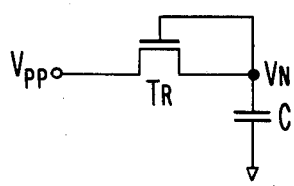
FIG. 1(a) is a circuit schematic of a prior art precharging circuit.
Figure 1B:
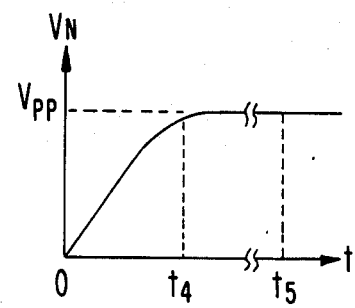
FIG. 1(b) is a plot of the increasing precharging voltage level developed on a storage capacitor of the prior art precharging circuit of FIG. 1(a)
Figure 2A:
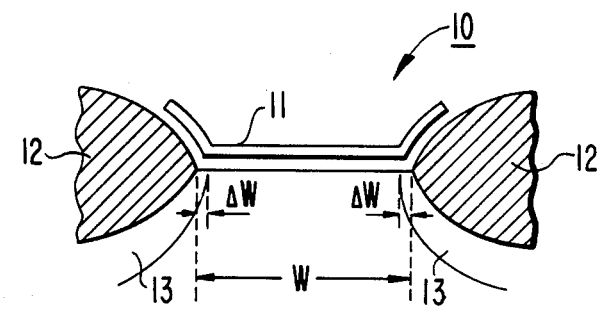
FIG. 2(a) is a cross-sectional, simplified and schematic view of a MIS transistor.
Figure 2B:
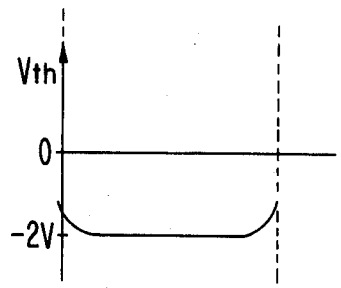
FIG. 2(b) is an illustrative plot of the threshold voltage across the channel width (W) of the illustrative MIST of FIG. 2(a)
Figure 3:
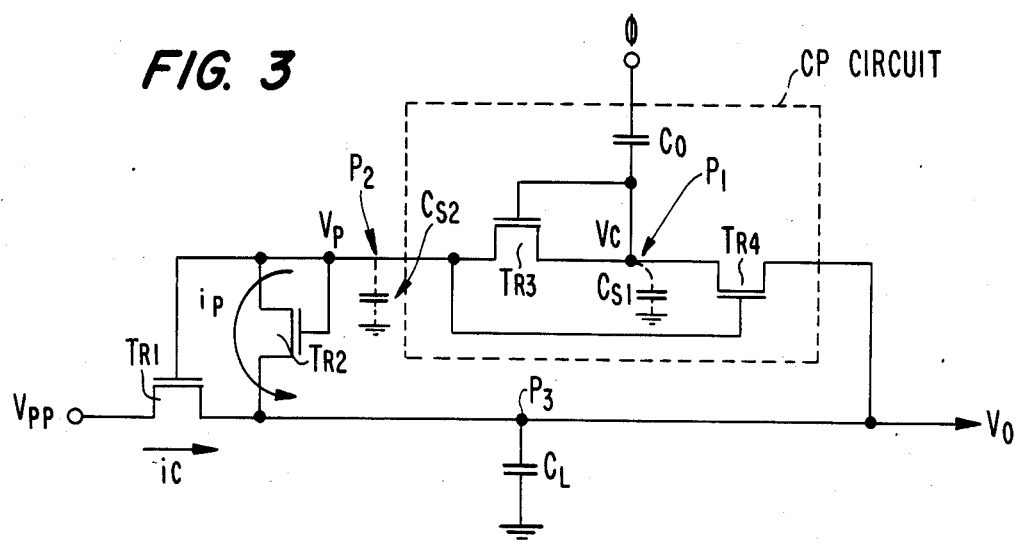
FIG. 3 is a circuit schematic of a precharging circuit in accordance with the present invention.

FIG. 3 is a circuit schematic of a precharging circuit in accordance with the present invention, as may be fabricated in a memory chip which incorporates therein, as well, an EEPROM or a NOVRAM. As before noted, since a NOVRAM incorporates the functions of an EEPROM, reference hereinafter shall be limited to an EEPROM but shall be understood to include and encompass a NOVRAM or other equivalent device implemented in a memory chip, as well. Consistent with a significant object of this invention, transistors $T_{R1}$ through $T_{R4}$ are conventional enhancement (E) type N channel MIS transistors.

Transistor $T_{R1}$ and precharging capacitor $C_L$ comprise a long time constant RC circuit. A charging current $i_c$ flows from a high voltage source $V_{pp}$ through transistor $T_{R1}$ to the precharging (i.e., charge storing) capacitor $C_L$, producing a precharging output voltage $V_o$ at the precharging node $P_3$. Node $P_3$ comprises the common junction of transistor $T_{R1}$, capacitor $C_L$, and also the voltage output of the circuit; more particularly, the output voltage $V_o$ developed at node $P_3$ may comprise an erase-write (E-W) voltage.

Components of the charge-pump (CP) circuit of FIG. 3 are enclosed in a dotted line rectangle and include a coupling capacitor $C_0$, and transistors $T_{R3}$ and $T_{R4}$ connected together at a common node $P_1$. Consistent with conventional notation, a capacitor $C_{S1}$ connected by phantom lines between the node $P_1$ and ground represents stray capacitance which exists, for example, due to the gate capacitance of transistor $T_{R3}$. The CP circuit is connected between the precharging node $P_3$ and through node $P_2$ to the gate of transistor $T_{R1}$, the transistors $T_{R3}$ and $T_{R4}$ being series connected at node $P_1$ therebetween. Further, a transistor $T_{R2}$ is connected at its source and gate to node $P_2$ and at its drain to node $P_3$. The precharging voltage $V_o$ developed at node $P_3$ is applied to the CP circuit as a source voltage, and the output voltage, $V_p$, of the CP circuit is applied to node $P_2$.

Figure 4:
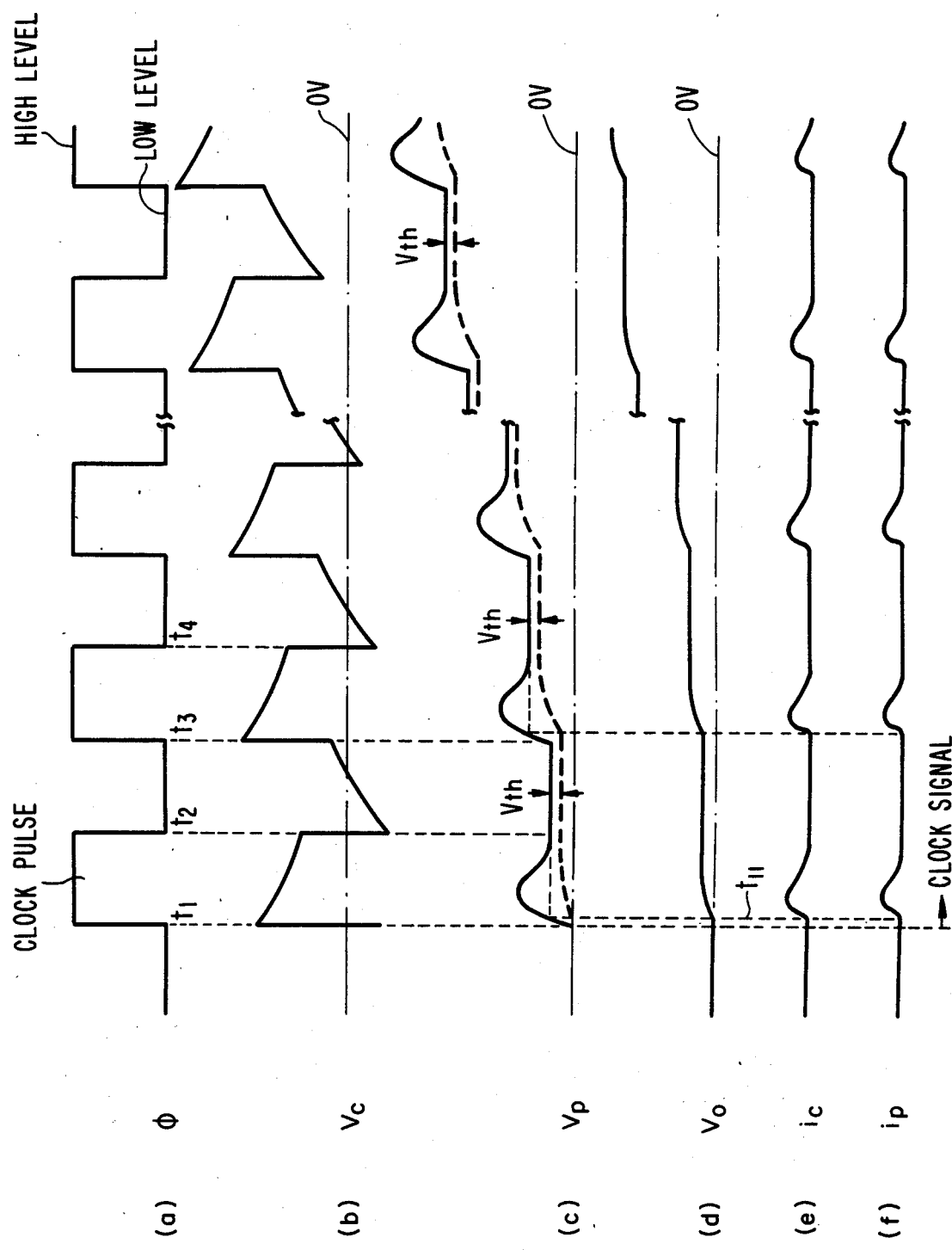
FIGS. 4(a) through 4(f) are plots of waveforms of clock pulses, voltages developed at specific nodes of the circuit of FIG. 3, and of currents flowing within various branches of the circuit of FIG. 3 during operation.

The function of the CP circuit will be explained with reference to FIGS. 4(a) through 4(f) which show various waveforms of the timing pulses applied to, and the resultant voltages and currents produced within, the circuit of FIG. 3. Particularly, FIG. 4(a) is a waveform of a train of clock pulses $\phi$ which is applied to the capacitor $C_0$ of the CP circuit as seen in FIG. 3. FIG. 4(b) is a plot of the waveform of voltage $V_c$ developed at node $P_1$ in the CP circuit. FIG. 4(c) is a plot of the waveform of the output voltage $V_p$ of the CP circuit, produced at node $P_2$. FIG. 4(d) is a plot of the precharging voltage $V_o$ produced at node $P_3$, constituting the output voltage of the precharging circuit of FIG. 3. FIG. 4(e) is a plot of the waveform of the current $i_c$ comprising the charging current which flows intermittently through the transistor $T_{R1}$ for charging capacitor $C_L$, in FIG. 3. Finally, FIG. 4(f) is a plot of the waveform of the source-drain current $i_p$ of the transistor $T_{R2}$ of FIG. 3.

The precharging circuit of the invention, including the CP circuit, remains inoperative as long as data stored in the associated EEPROM is not to be changed. However, when the memory chip incorporating the EEPROM and the precharging circuit of the invention receives a command from its associated computer system to change data stored therein, the clock pulse train, or signal, $\phi$ is applied to the CP circuit, which then initiates operation. The clock signal $\phi$ may be supplied by a conventional clock pulse oscillator which is fabricated in the memory chip in accordance with well known prior art techniques.

In the initial condition of the circuit of FIG. 3, the voltage $V_p$ at node $P_2$ is low, e.g., zero volts (0 V); as a result, transistors $T_{R3}$ and $T_{R4}$ are cut off. With concurrent reference to the waveforms of FIGS. 4(a) through 4(f), when a first clock pulse $\phi$ of FIG. 4(a) is applied, at time $t_1$, the voltage $V_c$ at node $P_1$ simultaneously rises, as shown in FIG. 4(b), to a level approaching the amplitude of the clock pulse—for example, $V_c$ may reach the voltage level of $+4.8$ V for a clock pulse amplitude of $+5$ V. The ratio between the level attained by voltage $V_c$ and the clock pulse $\phi$ amplitude is determined by the ratio of the capacitance of capacitor $C_0$ to the stray capacitance $C_{S1}$ which exists at node $P_1$ due to the gate capacitance of transistor $T_{R3}$, for example. The result is that transistors $T_{R3}$ and $T_{R4}$, respectively, are switched ON and OFF, the ON transistor $T_{R3}$ then conducting, or transferring, the charge on stray capacitance $C_{S1}$ to stray capacitance $C_{S2}$, the latter existing at node $P_2$ because of the gate capacitance of transistors $T_{R1}$ and $T_{R2}$, for example. Likewise, beginning at time $t_1$, the voltage $V_p$ at node $P_2$ begins to increase, as shown in FIG. 4(c), and correspondingly the voltage $V_c$ at node $P_1$ begins to decrease, as seen by comparison of FIGS. 4(b) and 4(c). The rates of increase of voltage $V_p$ and of decrease of the voltage $V_c$ are relatively slow because of the source-drain resistance of transistor $T_{R3}$.

When voltage $V_p$ increases to a level exceeding the threshold voltage $V_{th}$ of transistor $T_{R1}$, transistor $T_{R1}$ turns ON and permits the charging current $i_c$ to flow from high voltage source $V_{pp}$ to the precharging capacitor $C_L$. More particularly, with reference to FIGS. 4(c) through 4(f), the rising level of the voltage $V_p$ is shown to exceed the threshold voltage level $V_{th}$ at time $t_{11}$, whereupon the charging current $i_c$ begins to flow. The resultant charging of the precharging capacitor $C_L$ correspondingly causes the voltage $V_o$ at node $P_3$ to increase, as seen in FIG. 4(d). Transistor $T_{R2}$, however, suppresses the extent of, or limits, the increase in the voltage $V_p$. Particularly, when the level of voltage $V_p$ exceeds the threshold voltage $V_{th}$ of transistor $T_{R2}$, transistor $T_{R2}$ turns ON, causing a source-drain current $i_p$ to flow through transistor $T_{R2}$ to the precharging capacitor $C_L$, as shown in FIG. 4(f). Correspondingly, as the current $i_p$ flows, the voltage $V_p$ at node $P_2$ decreases, as shown in FIG. 4(c), thereby turning transistors $T_{R1}$ and $T_{R2}$ OFF. When OFF, transistor $T_{R1}$ no longer permits the flow of current $i_c$ which then terminates, as seen in FIG. 4(e). Thus, as seen by comparison of FIG. 4(a) and FIG. 4(f), the current $i_c$ flows only during the limited conducting period of transistor $T_{R1}$ corresponding to a portion of the duration of the positive clock pulse between $t_1$ and $t_2$.

The trailing edge of the positive clock pulse occurring at time $t_2$ causes the voltage $V_c$ at node $P_1$ to fall rapidly, as shown in FIG. 4(b), with the result that transistors $T_{R3}$ and $T_{R4}$ are switched OFF and ON, respectively. The rapid drop in the level of voltage $V_c$ is accompanied by a rapid negative charge being developed on stray capacitance $C_{s1}$, which then is gradually discharged by a discharge current which flows from the charging capacitor $C_L$ through transistor $T_{R4}$. As seen in FIG. 4(b), however, voltage $V_c$ has a mean value which increases gradually during the successive clock pulses. This results because the discharging current flowing through transistor $T_{R4}$ is supplied from the precharging capacitor $C_L$ which, likewise in successive clock pulses, produces the precharging voltage $V_o$ which incrementally increases with successive clock pulses.

On the other hand, the rapid drop in the level of voltage $V_c$, such as at time $t_2$, $t_4$, etc., causes transistor $T_{R3}$ to be rapidly turned OFF. As a result, the rapid drop in the level of voltage $V_c$ has almost no influence on the voltage $V_p$ which therefore remains substantially at its value established during the preceding clock pulse, as seen by comparison of the waveform of voltage $V_p$ in FIG. 4(c) during time interval $t_2$ with that during time interval $t_1$, during time interval $t_4$ with that of time interval $t_3$, and so forth. While, in fact, the rapid drop in the level of voltage $V_c$ is transferred to node $P_2$ through the gate capacitance of transistor $T_{R3}$, that gate capacitance is insignificant in comparison with the stray capacitance $C_{s2}$, such that the drop in voltage $V_c$ has no meaningful effect on the value of voltage $V_p$ at node $P_2$. Thus, the voltage $V_p$ maintains transistors $T_{R1}$ and $T_{R2}$ OFF, such as during time interval $t_2$, until the next clock pulse occurs at time $t_3$.

During the next clock pulse initiating at time $t_3$, and correspondingly for each successive clock pulse, the precharging circuit operates in the manner hereinbefore described. Accordingly, the precharging voltage $V_o$ incrementally increases in level for the successive clock pulses, as shown in FIG. 4(d), until the level of $V_o$ approaches that of the high voltage source $V_{pp}$. Thus, a long time interval is obtained for the charging function, even though the capacitance of the precharging capacitor $C_L$ is small.

When the precharging circuit of the invention is employed as a timer circuit, the end point, or completion, of the precharging operation is determined in accordance with the voltage $V_o$ at node $P_3$ reaching a predetermined voltage level, as may readily be achieved by any suitable prior art voltage level detecting circuit. When this condition is detected, a reset circuit (not shown), which may be of a conventional prior art design, resets the voltage $V_p$ at node $P_2$ and $V_o$ at node $P_3$ to the initial level of substantially 0 V, such as by discharging the associated capacitor.

The precharging circuit of the invention functions to assure that transistors $T_{R1}$ and $T_{R2}$ are always turned ON at the leading edge of each successive clock pulse, because the voltage $V_p$ is always adjusted to a level just less than the sum of the voltages $V_o + V_{th}$ during the low level of the clock signal (e.g., at the time interval $t_2$). Therefore, a special D type MIST requiring an ion implantation mask for its fabrication, as before described, is not necessary for implementing the function of transistors $T_{R1}$ and $T_{R2}$ and instead an ordinary E type MIST is sufficient. Likewise, ordinary E type MIST devices may be employed as transistors $T_{R3}$ and $T_{R4}$ in the CP circuit.

Figure 5:
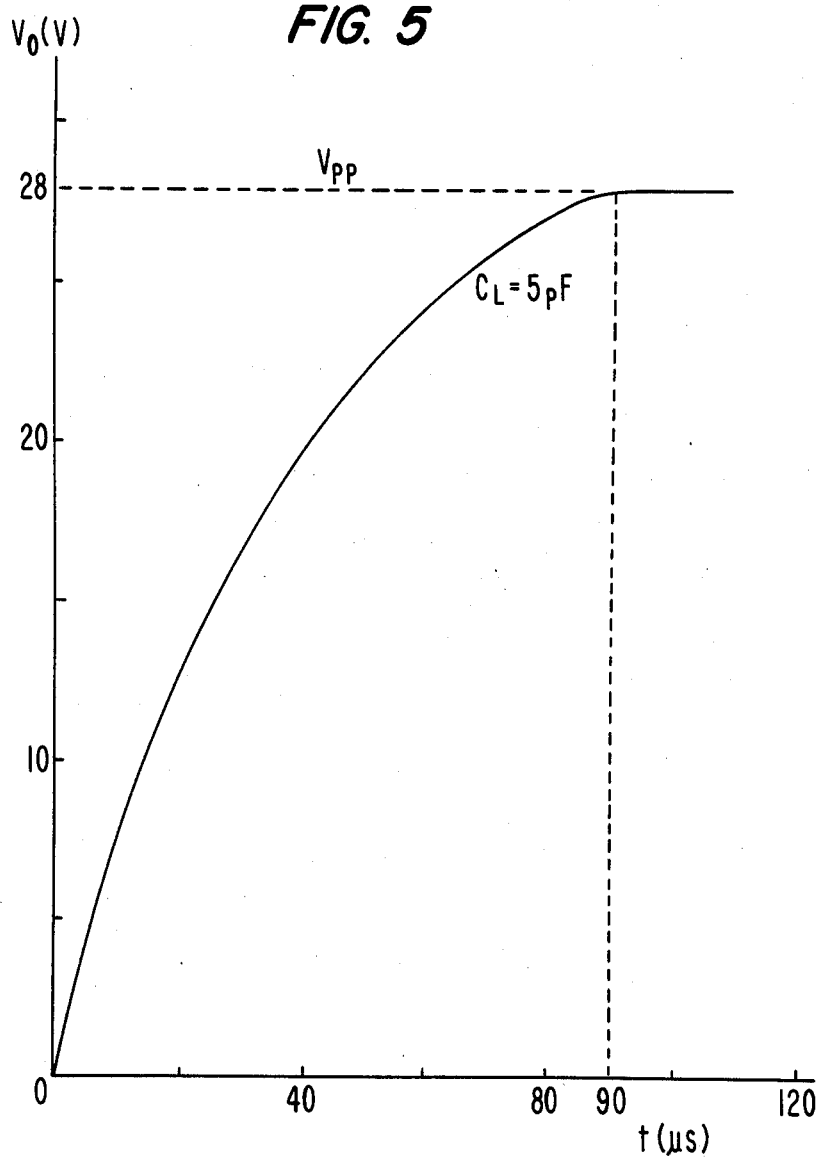
FIG. 5 is a plot of the increase in level of the precharging voltage relative to time, as produced by the precharging circuit of the invention in accordance with the circuit schematic of FIG. 3.

FIG. 5 is a graph representing a simulation of the charging operation of the precharge circuit of the invention. The results are indicated for the circuit in a simulated implementation wherein: $V_{pp} = 28$ V; precharging capacitor $C_L$ has a capacitance of 5 pF; the clocking signal has a frequency of 8 MHz (mega-Hertz) and an amplitude of 5 V; the ratio of channel width to length, W/L, for transistors $T_{R1}$, $T_{R3}$ and $T_{R4}$, is 4 $\mu$m/4 $\mu$m and for transistor $T_{R2}$ is 4 $\mu$m/16 $\mu$m; and the ratio of width to length of the coupling capacitor $C_0$ is 20 $\mu$m/20 $\mu$m. These conditions are consistent with the use of ordinary E type MIST's for all transistors of the precharging circuit of FIG. 3, as before noted. Further, the value of 5 pF for the precharging capacitor $C_L$ is standard and thus a MIST having a channel dimension of 100 $\mu$m width (W) $\times$ 100 $\mu$m length (L) and employing a capacitor having a dielectric of silicon dioxide (SiO$_2$) and a thickness of 600 Å (Angstroms) may be employed. FIG. 5 more specifically is a plot of the precharging voltage $V_o$ relative to time, in microseconds, for these conditions and reveals that a precharging time of 90 $\mu$m is afforded, at which time the voltage $V_o$ developed on the charging capacitor $C_L$, of only 5 pF, approaches substantially the level of the high voltage $V_{pp} = 28$ V. Moreover, the time required for completion of the precharging function can be controlled by varying the characteristics of the transistors $T_{R1}$ and $T_{R2}$ and/or the capacitance of the coupling capacitor $C_0$ in accordance with conventional RC time constant circuit determinations.

Numerous modifications and adaptations of the precharging circuit of the invention will be apparent to those of skill in the art and thus is intended by the appended claims to cover all such modifications and adaptations which fall within the true spirit and scope of the invention.

What is claimed is:

1. A precharging circuit for charging a precharging node to a high voltage level, relative to ground potential, from a high voltage source under control of a series of clock pulses, successive clock pulses being separated by corresponding interim time intervals and each clock pulse having a leading edge and a trailing edge defining therebetween a corresponding clock pulse time interval, comprising:

a precharging capacitor connected between said precharging node and ground for developing a voltage at the precharging node having a level which incrementally increases to a high voltage level approaching that of the high voltage source;

a first MIS transistor having a gate, a source and a drain, one of said source and drain being operatively connected to the high voltage source and the other of said source and drain being operatively connected to said precharging node, said first MIS transistor having a predetermined threshold voltage for conduction;

a further node;

a charge-pump circuit operatively connected between said precharging node and through said further node to said gate of said first MIS transistor;

means for applying a series of clock pulses to said charge-pump circuit, said charge-pump circuit responding to each of said clock pulses to generate a voltage at said further node which has a higher level than the predetermined threshold voltage for conduction of said first MIS transistor, relative to the currently existing voltage level at said precharging node, thereby to turn said first MIS transistor on and permit a flow of charging current therethrough from said high voltage source to said precharging capacitor thereby to produce an increase in the voltage level at the precharging node; and voltage suppressing means having a predetermined threshold value for operation and operatively connected between said further node and said precharging node and responsive to said higher level voltage at said further node exceeding the voltage at said precharging node by said predetermined threshold value for operation of said voltage suppressing means so as to reduce the voltage level at said further node and turn said first MIS transistor off, said first MIS transistor thus being turned on only for a portion of the respective clock pulse time interval of each of successive clock pulses applied to said charge-pump circuit to permit corresponding, incremental flows of charging current to said precharging capacitor for charging said precharging node to a voltage level approaching that of said high voltage source.

2. A precharging circuit as recited in claim 1, wherein said first MIS transistor is of the enhancement type.

3. A precharging circuit as recited in claim 1, wherein said voltage suppressing means comprises a second MIS transistor having a gate, a source and a drain, said gate and drain of said second MIS transistor being operatively connected to said further node and said source of said second MIS transistor being operatively connected to said precharging node.

4. A precharging circuit as recited in claim 1, wherein said first and second MIS transistors are of the enhancement type.

5. A precharging circuit for charging a precharging node to a high voltage level, relative to ground potential, from a high voltage source under control of a series of clock pluses, successive clock pulses being separated by corresponding interim time intervals and each clock pulse having a leading edge and a trailing edge defining therebetween a corresponding clock pulse time interval, comprising:

a precharging capacitor connected between said precharging node and ground for developing a voltage at said precharging node having a level which incrementally increases to a high voltage level approaching that of the high voltage source;

a first MIS transistor having a gate, a source and a drain, one of said source and drain being operatively connected to the high voltage source and the other of said source and drain being operatively connected to said precharging node, said first MIS transistor having a predetermined threshold voltage for conduction;

a further node;

a charge-pump circuit operatively connected between said precharging node and through said further node to said gate of said first MIS transistor, said charge pump circuit comprising a coupling capacitor having first and second terminals, first means connected between said second terminal of said coupling capacitor and said further node and second means operatively connected between said precharging node and said second terminal of said coupling capacitor;

means operatively connected to said first terminal of said coupling capacitor for applying a series of clock pulses to said charge-pump circuit, said first means of said charage-pump circuit responding to each said clock pulse for permitting a current to flow from said second terminal of said coupling capacitor to said further node during the corresponding clock pulse interval and said second means being responsive to the trailing edge of each said clock pulse for permitting a current to flow from said precharging node to said second terminal of said coupling capacitor during the interim time interval preceding a next successive clock pulse, to generate a voltage at said further node which has a higher level than the voltage level at said precharging node and thereby to turn said first MIS transistor on and permit a flow therethrough of charging current from said high voltage source to said precharging capacitor thereby to produce an increase in the voltage level at the precharging node; and voltage suppressing means having a predetermined threshold value for operation and operatively connected between said further node and said precharging node and responsive to said higher level voltage at said further node exceeding the voltage level at said precharging node by said predetermined threshold value for operation of said voltage suppressing means so as to reduce the voltage level at said further node and turn said first MIS transistor off, said first MIS transistor thus being turned on only for a portion of the clock pulse time interval of each of successive clock pulses applied to said charge-pump circuit to permit corresponding, incremental flows of charging current to said precharging capacitor for charging said precharging node to a voltage level approaching that of said high voltage source.

6. A precharging circuit as recited in claim 5, wherein said first means comprises a third MIS transistor having a gate operatively connected to said second terminal of said capacitor, a source and a drain, one of said source and drain being connected to said second terminal of said capacitor and the other of said source and drain being connected to said further node.

7. A precharging circuit as recited in claim 5, wherein said second means comprises a fourth MIS transistor having a gate connected to said further node, a source and a drain, one of said source and drain of said fourth MIS transistor being connected to said second terminal of said capacitor and the other of said source and drain of said fourth MIS transistor being connected to said precharging node.

8. A precharging circuit as recited in claim 6, wherein said second means comprises a fourth MIS transistor having a gate connected to said further node, a source and a drain, one of said source and drain of said fourth MIS transistor being connected to said second terminal of said capacitor and the other of said source and drain of said fourth MIS transistor being connected to said precharging node.

9. A precharging circuit as recited in claim 8, wherein each of said third and fourth MIS transistors is of the enhancement type.

10. A precharging circuit implemented in a semiconductor memory chip for charging a precharging node to a high voltage level from a high voltage source under control of a series of clock pulses, successive clock pulses being separated by corresponding interim time intervals and each clock pulse having a leading edge and a trailing edge defining therebetween a corresponding clock pulse time interval, comprising:

a first terminal for connection to the high voltage source;

a precharging node defining an output terminal of said precharging circuit;

a charge storage capacitor connected between said precharging node and a reference potential for developing a voltage at said precharging node having a level which incrementally increases to a high voltage level approaching that of the high voltage source;

a second node;

a first MIS transistor having source, drain and gate terminals and operatively connected at said source, drain and gate terminals thereof respectively to the high voltage source terminal, to said precharging node and to said second node, said first MIS transistor having a predetermined threshold voltage for conduction;

a charge pump circuit operatively connected between said precharging node and through said second node to said gate of said first MIS transistor, said charge pump circuit comprising a third node therein, first and second means connected in series at said third node and respectively to said second node and to said precharging node, a clock pulse input terminal to which the series of clock pulses is applied, and a coupling capacitor connected between said clock pulse input terminal and said third node;

means for applying the series of clock pulses to said charge pump circuit, each said clock pulse being applied to said third node through said coupling capacitor for developing a charge thereon and producing an increase in the voltage level of said third node;

said first means being responsive to the leading edge of each said clock pulse for transferring the charge at said third node to said second node thereby to produce an increase in the voltage level at said second node and thereby to render said first MIS transistor conductive when the voltage level at said second node exceeds the predetermined threshold voltage for conduction of said first MIS transistor, relative to the voltage level of said precharging node;

said charge-pump circuit responding to the trailing edge of each said clock pulse to lower the voltage level of said third node, said first means being rendered nonconductive thereby and said second means being rendered conductive thereby so as to increase the voltage level of said third node in accordance with the voltage level of said precharging node during the interim time interval preceding a next successive clock pulse; and third means having a predetermined threshold voltage for operation and connected between said gate and said drain of said first MIS transistor and responsive to the voltage level at said second node exceeding said predetermined threshold voltage for operation of said third means, relative to the voltage level of said precharging node, for permitting a charging current to flow from said second node to said precharging node and thereby reduce the voltage level at said second node for terminating conduction of said first MIS transistor within the clock pulse time interval of each clock pulse.

11. A precharging circuit as recited in claim 10, wherein each of said first, second and third means comprises a MIS transistor.

12. A precharging circuit as recited in claim 11, wherein each of said MIS transistors is of the enhancement type.

* * * * *

UNITED STATES PATENT AND TRADEMARK OFFICE
CERTIFICATE OF CORRECTION

PATENT NO. : 4,703,196

DATED : October 27, 1987

INVENTOR(S) : ARAKAWA

It is certified that error appears in the above-identified patent and that said Letters Patent is hereby corrected as shown below:

Col. 2, line 13, change "pressented" to --presented--.

Col. 9, line 56, change "Vo" to --$V_o$--.

Col. 10, line 31, change "90 µm" to --90 µs--.

Col. 13, line 30, change "charge pump" to --charge-pump--;

line 33, change "charge pump" to --charge-pump--;

line 42, change "charge pump" to --charge-pump--.

Signed and Sealed this

Twenty-fourth Day of May, 1988

Attest:

DONALD J. QUIGG

Attesting Officer

Commissioner of Patents and Trademarks